(12) United States Patent
Matsuno

(10) Patent No.: US 10,931,234 B2
(45) Date of Patent: Feb. 23, 2021

(54) OSCILLATOR CIRCUIT

(71) Applicant: RENESAS ELECTRONICS CORPORATION, Tokyo (JP)

(72) Inventor: Noriaki Matsuno, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/831,177

(22) Filed: Mar. 26, 2020

(65) Prior Publication Data
US 2020/0343858 A1 Oct. 29, 2020

(30) Foreign Application Priority Data
Apr. 23, 2019 (JP) ................. 2019-081990

(51) Int. Cl.
H03B 5/24 (2006.01)
H03K 3/0231 (2006.01)
H03K 4/502 (2006.01)

(52) U.S. Cl.
CPC ............. *H03B 5/24* (2013.01); *H03K 3/0231* (2013.01); *H03K 4/502* (2013.01)

(58) Field of Classification Search
CPC ........ H03K 3/0231; H03K 4/50; H03K 4/501; H03K 4/502; H03B 5/24
See application file for complete search history.

(56) References Cited

U.S. PATENT DOCUMENTS 9,356,554 B2 * 5/2016 Tam .................. H03K 4/502
9,680,413 B2 6/2017 Paidimarri et al.

* cited by examiner

Primary Examiner — Ryan Johnson
(74) Attorney, Agent, or Firm — McDermott Will & Emery LLP

(57) ABSTRACT

A small area oscillator circuit is provided. The oscillator circuit includes first and second constant current sources, a comparator, first and second capacitive elements, and a resistive element. In a first state, the first capacitive element is connected to the first constant current source and the fixed voltage node, the second capacitive element is connected to the second constant current source and the first current source, and resistive element is connected to the second constant current source. In a second state, the first capacitive element is connected to the second constant current source and first constant current source, the second capacitive element is connected to the second constant current source and the fixed voltage node, and the resistive element is connected to the first constant current source.

7 Claims, 16 Drawing Sheets

OSCILLATOR CIRCUIT

CROSS-REFERENCE TO RELATED APPLICATIONS

The disclosure of Japanese Patent Application No. 2019-081990 filed on Apr. 23, 2019 including the specification, drawings and abstract is incorporated herein by reference in its entirety.

BACKGROUND

The present disclosures relate to an oscillator circuit.

The Background of the Invention

A clock oscillator circuit is built in a semiconductor device such as a general purpose microcomputer. The clock oscillator circuit is a circuit for generating a clock signal for defining an operation of internal modules such as a CPU (Central Processing Unit) and a peripheral functional block.

In order to reduce a size and cost of the device, so-called an on-chip oscillator, which is configured without an external component such as a crystal oscillator, may be used for the clock oscillator circuit. Generally, a frequency accuracy of an on-chip oscillator is lower than that of a clock oscillator circuit using an external oscillator. Therefore, applications of the on-chip oscillator are limited.

There are disclosed techniques listed below.
<Patent Document 1> U.S. Pat. No. 9,680,413

Patent Document 1 discloses a clock oscillator circuit requiring a low power. Specifically, an RC oscillator circuit is shown in which an oscillation frequency is determined by a resistance value and a capacitance value. The oscillation frequency is determined by the resistance value and the capacitance value.

The clock oscillator circuit of the Patent Document 1 is composed of two constant currents, a resistor capacitance, and a comparator. The clock oscillator circuit generates a reference voltage by one constant current passing through a resistor and charges a capacitor by the other constant current. Here, the voltage of the capacitor rises in proportion to time. The comparator compares the voltages of the capacitance with the reference voltage, and based on the comparison result, a clock signal is generated. Oscillator is performed by repeating these operations. The time it takes for the capacitance to reach the reference voltage corresponds to half the time of an oscillation period. Therefore, when the oscillation period is T, the resistance value of the resistive element is R, and the capacitance value of the capacitive element is C, the oscillation period T is twice the product of resistance value R and capacitance value C, and is defined as the following equation (1).

$$T=2RC \tag{1}$$

Prior-Art Document

SUMMARY

However, the oscillator circuit disclosed in Patent Document 1 has a problem that the resistive element and the capacitive element becomes large, particularly when a low oscillation frequency is required as a desired oscillation frequency, such as in real-time clock.

The present disclosure is to solve the above-mentioned problems, and the present disclosure provides an oscillator circuit having a small area. Other objects and novel features will become apparent from the description of the specification and drawings.

Means of Solving the Problems

According to one Embodiment, the oscillator circuit comprises: a first constant current source; a second constant current source; a comparator, one input terminal of which is connected to the first constant current source and the other input terminal of which is connected to the second constant current source; a first capacitive element; a second capacitive element; a resistive element, one of which is connected to one of the first and second constant current source and the other of which is connected to a fixed voltage node; and a switch control circuit for controlling the connection relationship of the first and second constant current source, the fixed voltage node, the first and second capacitive elements, and the resistive element. The switch control circuit switches between a first state in which one of the first capacitor elements is connected to the first constant current source, the other is connected to the fixed voltage node, one of the second capacitor elements is connected to the second constant current source, the other is connected to the first constant current source, and one side of the resistor elements is connected to the second constant current source, and a second state in which one of the first capacitor elements is connected to the second constant current source, the other is connected to the second constant current source, one of the second capacitor elements is connected to the second constant current source, and the other is connected to fixed voltage node, and one side of the resistor elements is connected to the first constant current source, according to the output of comparator.

Effect of the Invention

According to one Embodiment, an RC time constant for realizing the oscillator circuit of the same frequency can be made smaller than the RC time constant of the comparative example. The area of at least one of the resistive element and the capacitive element can be reduced to reduce the area of the oscillator circuit.

DETAILED DESCRIPTION

Figure 1:
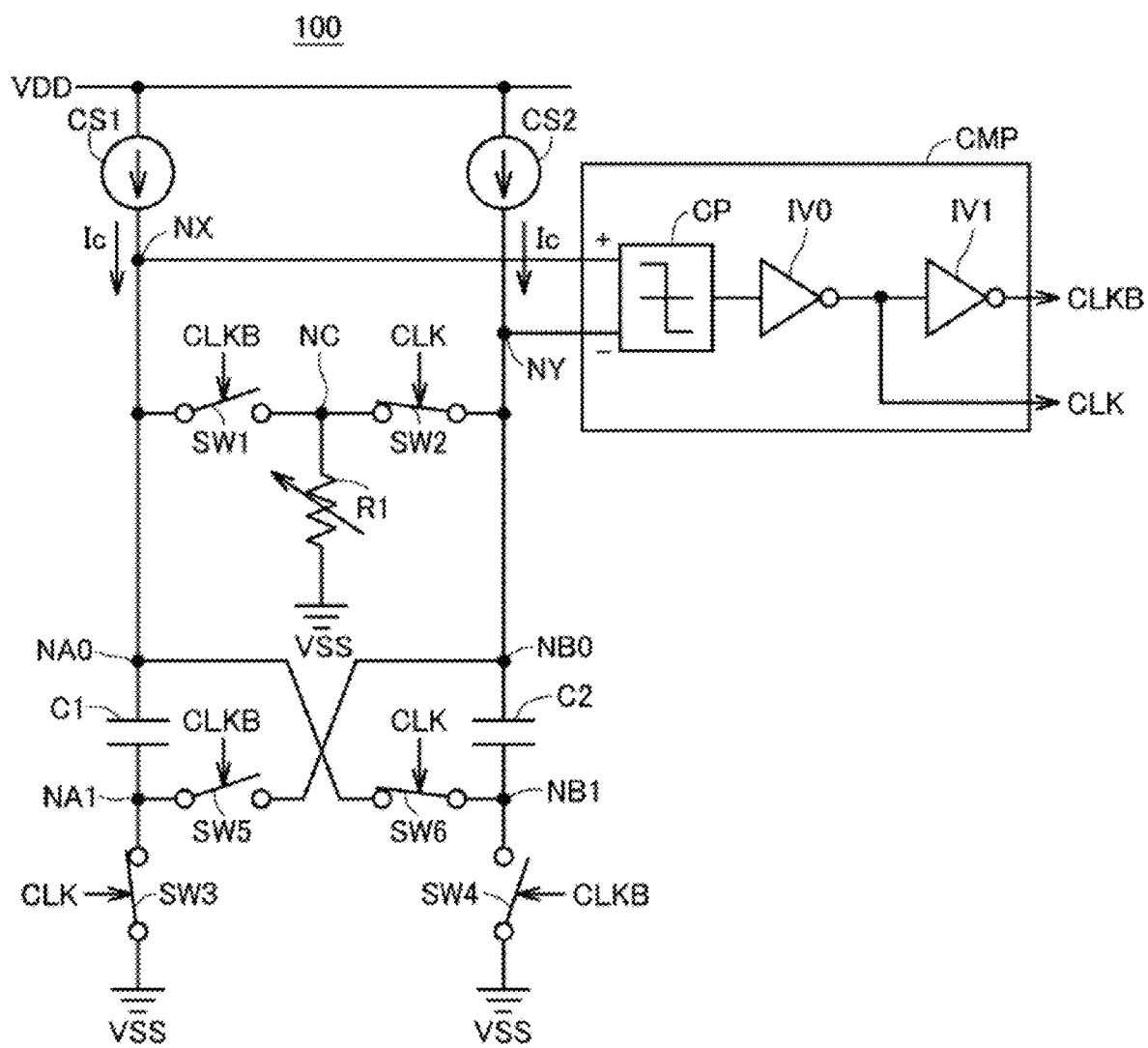
FIG. 1 is a diagram illustrating a configuration of an oscillator circuit 100 according to the first embodiment.

DETAILED DESCRIPTION OF THE INVENTION In the drawings, the same or corresponding components are denoted by the same reference numerals, and description thereof will not be repeated.

First Embodiment

FIG. 1 is a diagram illustrating a configuration of an oscillation circuit 100 according to a first embodiment.

Referring to FIG. 1, an oscillator circuit 100 includes: current sources CS1 and CS2, a resistive element R1, capacitive elements C1 and C2, switches SW1 to SW6; and a comparing unit CMP. The switches SW1 to SW6 receive an input of the positive phase clock signal CLK or a reversed phase clock signal CLKB to perform a switching operation.

The comparing unit CMP includes a comparator CP and inverters IV0 and IV1. The inverter IV0 inverts the output of the comparator CP to output the positive phase clock signal CLK.

Inverter IV1 inverts the input of inverter IV0 and outputs a reversed phase clock signal CLKB.

In the capacitive element C1, one is a node NA0 and the other is a node NA1. In the capacitive element C2, one is a node NB0 and the other is a node NB1.

The current source CS1, CS2 are configured by a current mirror circuit using a MOS transistor, for example.

The switches SW1 to SW6 are composed of, for example, a MOS transistor. The current source CS1 is connected between a power supply node (power supply voltage VDD) and the node NX and provides a constant current Ic.

Current source CS2 is connected between the power supply node (power supply voltage VDD) and the node NY and provides constant current Ic.

One input terminal of the comparator CP is connected to the node NX, and the other is connected to the node NY. The comparator CP compares the potential of the node NX and the potential of the node NY, and outputs a signal corresponding to the result of the comparison.

The node NA0 of the capacitive element C1 is connected to the node NX. The node NA1 of the capacitive element C1 is connected to a fixed voltage VSS (fixed voltage node) via the switch SW3. The switch SW3 receives a positive phase clock signal CLK.

The node NB0 of the capacitive element C2 is connected to the node NY. The node NB1 of the capacitive element C2 is connected to the fixed voltage VSS (fixed voltage node) via the switch SW4. The switch SW4 receives the reversed phase clock signal CLKB.

The switch SW1 is connected between the node NX and the node NC, and receives the input of the reversed phase clock signal CLKB.

The switch SW2 is connected between the node NY and the node NC, and receives the input of the positive phase clock signal CLK.

The switch SW5 is connected between the node NA1 and the node NB0 and receives the input of the reversed phase clock signal CLKB.

The switch SW6 is connected between the node NA0 and the node NB1, and receives the input of the positive phase clock signal CLK.

The switches SW1 to SW6 constitute a switch control circuit for controlling the connection relationships between the current sources CS1, CS2 and the fixed voltage node (fixed voltage VSS), the capacitive elements C1, C2 and the resistive element R1.

The resistive element R1 is connected between the node NC and the fixed voltage node (fixed voltage VSS). The resistive element R1 is a variable resistive element whose resistance value is adjustable. The oscillation frequency can be adjusted by adjusting the resistance value. The oscillation frequency can be adjusted not only by adjusting the resistance value but also by adjusting the capacitance values of the capacitive elements C1 and C2. Specifically, oscillation frequency can also be adjusted by adding adjusting mechanisms to the capacitive elements C1 and C2 to adjust the capacitance values of the capacitive elements C1 and C2, or by adjusting both the capacitance values of the capacitive elements C1 and C2 and the resistance value of the resistive element R1.

(Operation of the oscillator circuit) Next, the operation of the oscillator circuit will be described.

The switches SW1, SW4, and SW5 are controlled by the reversed phase clock signal CLKB, and are controlled to be turned on when, for example, the reversed phase clock signal CLKB is at the H level.

The switches SW2, SW3, and SW6 are controlled by the positive phase clock signal CLK, and are controlled to be turned on when, for example, the positive phase clock signal CLK is at the H level.

When the positive phase clock signal CLK is at the "H" level, switches SW2, SW3 and SW6 are turned on, and switches SW1, SW4 and SW5 are turned off. When the reversed phase clock signal CLK is at "H" level, switches SW2, SW3 and SW6 are turned off, and switches SW1, SW4 and SW5 are turned on.

Figure 2:
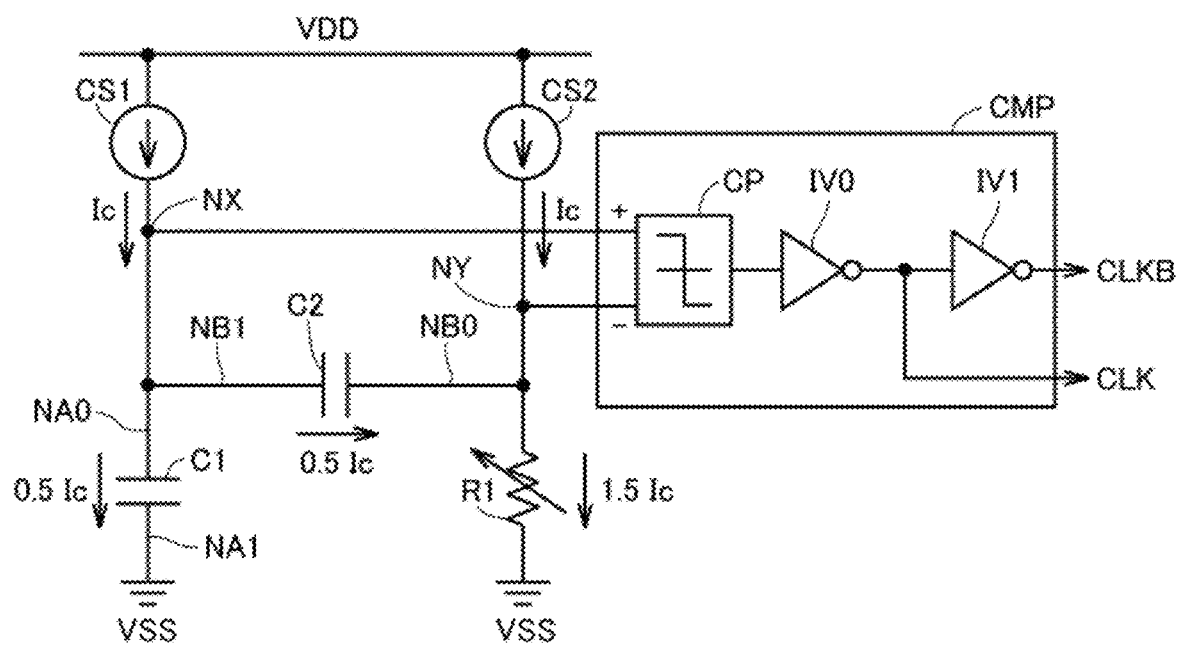
FIG. 2 is a diagram for explaining an equivalent circuit when the positive phase clock signal CLK of the oscillator circuit 100 according to the first embodiment is at the H level.

FIG. 2 is a diagram for explaining an equivalent circuit when the positive phase clock signal CLK of the oscillator circuit 100 according to the first embodiment is at the H level.

As shown in FIG. 2, the capacitive element C1 is charged by a current of 0.5 Ic of the constant current Ic supplied from the current source CS1. As a result, the potential of the node NA0 rises in proportion to time.

The remaining 0.5 Ic of constant current I supplied from current source CS1 discharges the charge stored in capacitive element C2.

The current 1.5 Ic, which is the sum of the current 0.5 Ic discharged from the capacitive element C2 and the current Ic supplied from the current source CS2, flows to the resistive element R1.

As a result, the potential of the node NY becomes a constant voltage determined from the resistance value of the node resistive element R1 and the current value flowing to the node resistive element R1.

When the potential of the node NX, which rises over time, reaches the potential of the node NY, the output of the comparator CP is inverted. The positive phase clock signal CLK outputted from the inverter IV0 transitions from the "H" level to the "L" level. The reversed phase clock signal CLKB output from inverter IV1 shifts from the "L" level to the "H" level.

Figure 3:
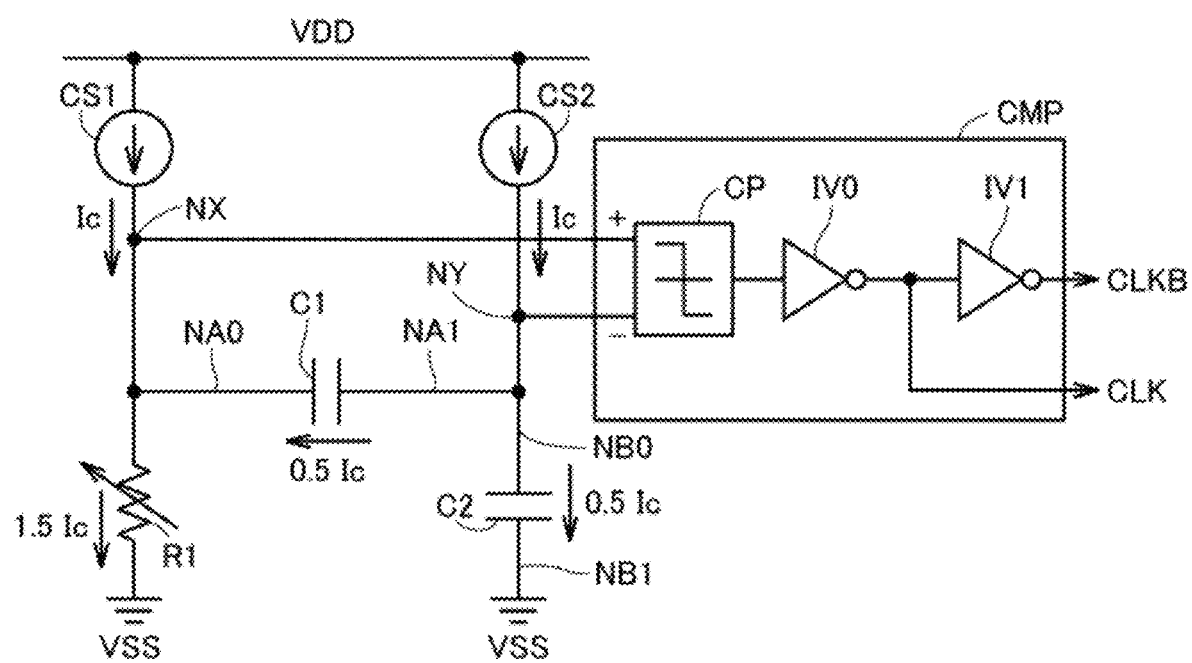
FIG. 3 is a diagram for explaining an equivalent circuit when the reversed phase clock signal CLKB of the oscillator circuit 100 according to the first embodiment is at the H level.

FIG. 3 is a diagram for explaining an equivalent circuit when the reversed phase clock signal CLKB of the oscillator circuit 100 according to the first embodiment is at the H level.

As shown in FIG. 3, of the constant current Ic supplied from the current source CS2, the capacitive element C2 is charged by a current of 0.5 Ic. As a result, the potential of the node NB0 rises in proportion to time.

The remaining current 0.5 Ic of the constant current Ic supplied from the current source CS2 discharges the charge stored in the capacitive element C1.

The current 1.5 Ic, which is the sum of the current 0.5 I discharged from the capacitive element C1 and the current Ic supplied from the current source CS1, flows to the resistive element R1.

As a result, the potential of the node NX becomes a constant voltage determined from the resistance value of the resistive element R1 and the current value flowing to the resistive element R1.

When the potential of the node NY, which rises over time, reaches the potential of the node NX, the output of the comparator CP is inverted. The positive phase clock signal CLK outputted from the inverter IV0 transitions from the "L" level to the "H" level. The reversed phase clock signal CLKB output from the inverter IV1 shifts from the "H" level to the "L" level.

In this way, the positive phase clock signal CLK repeats transitions from the "H" level to the "L" level and from the "L" level to the "H" level. Therefore, the oscillator circuit 100 performs the oscillation operation by the process.

Figure 4:
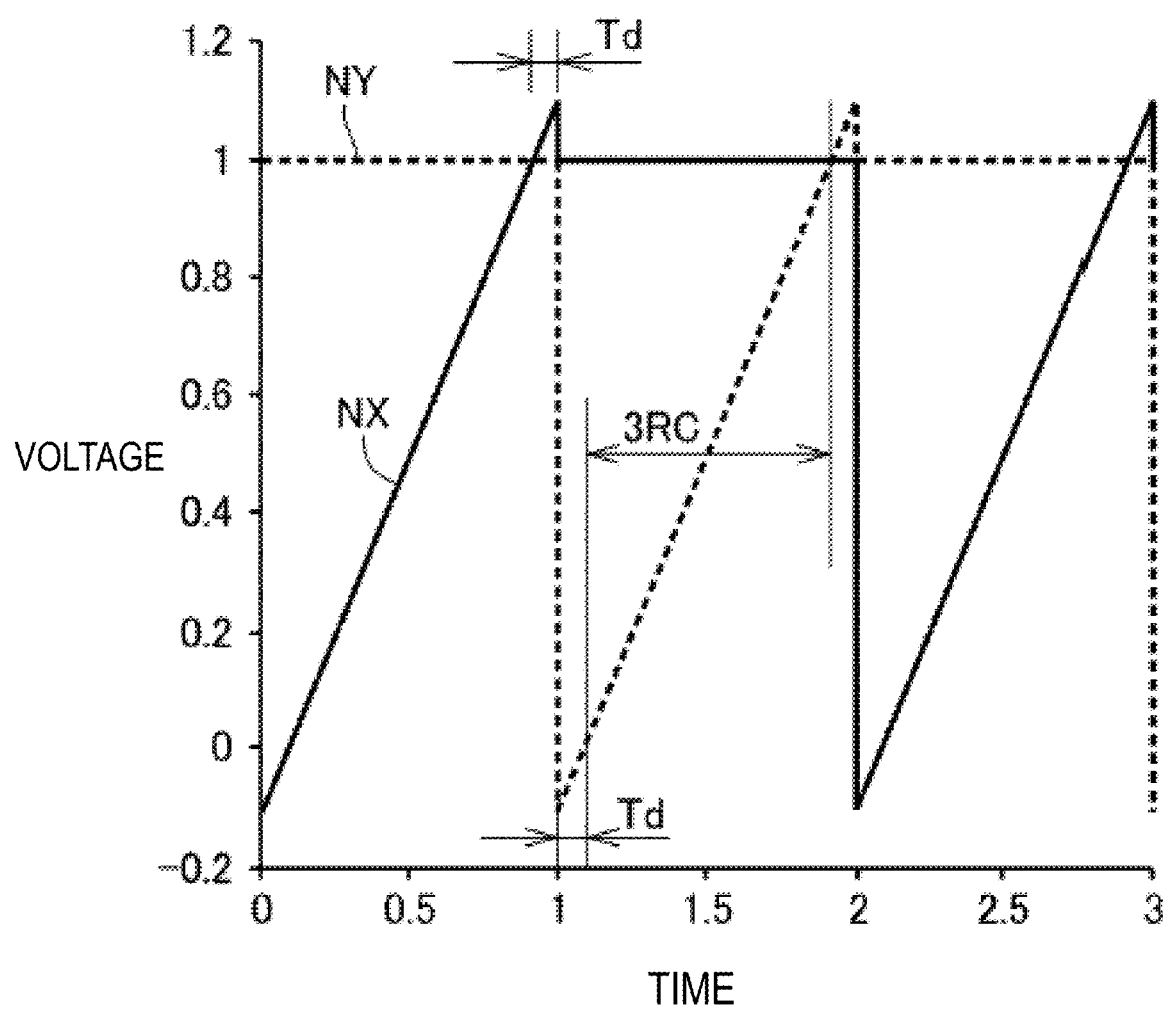
FIG. 4 is a diagram illustrating changes in the potentials of the nodes NX and NY of the oscillator circuit 100 according to first embodiment.

FIG. 4 is a diagram for explaining changes in the potentials of the nodes NX and NY of the oscillator circuit 100 according to first embodiment.

As shown in FIG. 4, the period until the potential of the node NX reaches the constant voltage (reference voltage) of the node NY corresponds to the period of ½ of the period oscillation period. The capacitive element C1 is charged by a current of 0.5 Ic, and the potential of the node NX rises.

Therefore, when the oscillation period is defined as T, the capacitance values of capacitive elements C1 and C2 are defined as C, the resistance value of resistive element R1 is defined as R, and the current value of current sources CS1 and CS2 is defined as Ic, the relation of the following equation (2) is established.

$$0.5\ Ic(T/2)/C = 1.5\ Ic \cdot R \tag{2}$$

Therefore, the oscillation period T is determined as shown in an Equation (3) and is six times the product of the resistance value R and the capacitance C.

$$T = 6RC \tag{3}$$

As shown in FIG. 4, in an actual circuit, the comparator CP has a delay time from the time the input signal changes until the output signal changes. As a result, an overshoot occurs in the nodes NX and NY.

Figure 5:
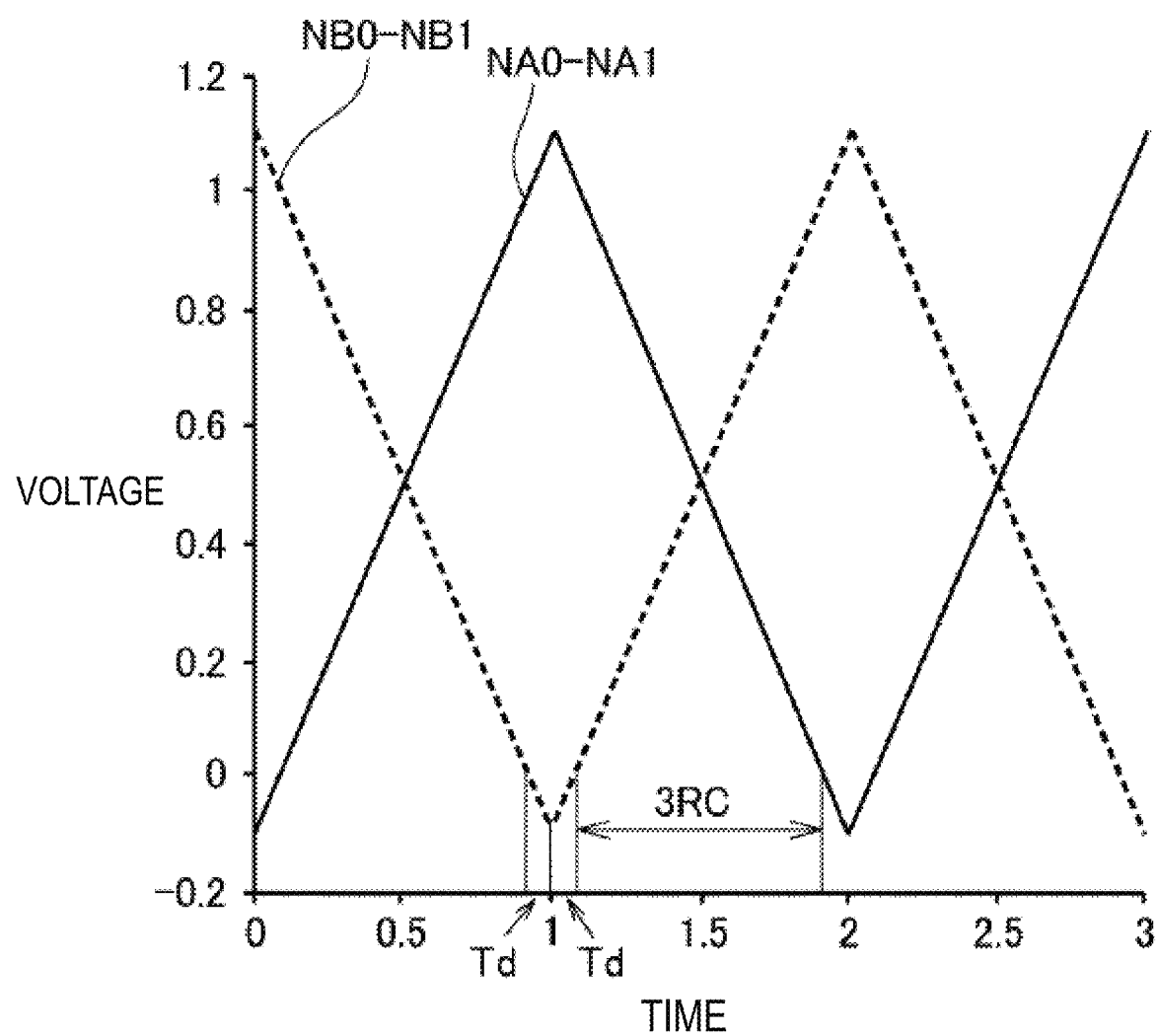
FIG. 5 is a diagram illustrating transitions of voltages between terminals of the capacitive elements C1 and C2 of the oscillator circuit 100 according to the first embodiment.

FIG. 5 is a diagram for explaining transitions of voltages between terminals of the capacitive elements C1 and C2 of the oscillator circuit 100 according to the first embodiment.

As shown in FIG. 5, the terminal voltages of the capacitive elements C1 and C2 are ideally a triangular waves that reciprocate between 0 and the reference voltage. On the other hand, as shown in the figure, since two undershoots and two overshoots occur, the cycle is delayed by that amount.

Taking this into account, the oscillation period Ta of the oscillator circuit 100 is determined by the following equation (4) when the delay time of the comparator CP is Td.

$$Ta = 6RC + 4Td \tag{4}$$

(effects of an oscillation frequency accuracy) delay time Td of the comparator CP is varied by noise components such as transistor elements constituting the comparator CP. The dominant term of the power noise is the fluctuation of the delay time Td due to a low frequency noise. In order to improve the frequency accuracy, a ratio of Td in the oscillation period Ta needs to be reduced.

As a comparative example, in a conventional method, the oscillation period considering the delay time of comparator is determined by the following equation (5).

$$Ta = 2RC + 2Td \tag{5}$$

Therefore, compared with comparator according to the comparative example, the product of RC when setting the same frequency can be ⅓, it is possible to significantly reduce the circuit area.

Furthermore, according to the oscillator circuit 100 according to first embodiment, the contribution ratio of the delay time Td of the comparator CP in the oscillation period is smaller than that of the comparator according to the comparative examples. Therefore, it is possible to suppress the deterioration of the accuracy of the oscillation frequency due to the variation of the delay time of the comparator CP.

Second Embodiment

Figure 6:
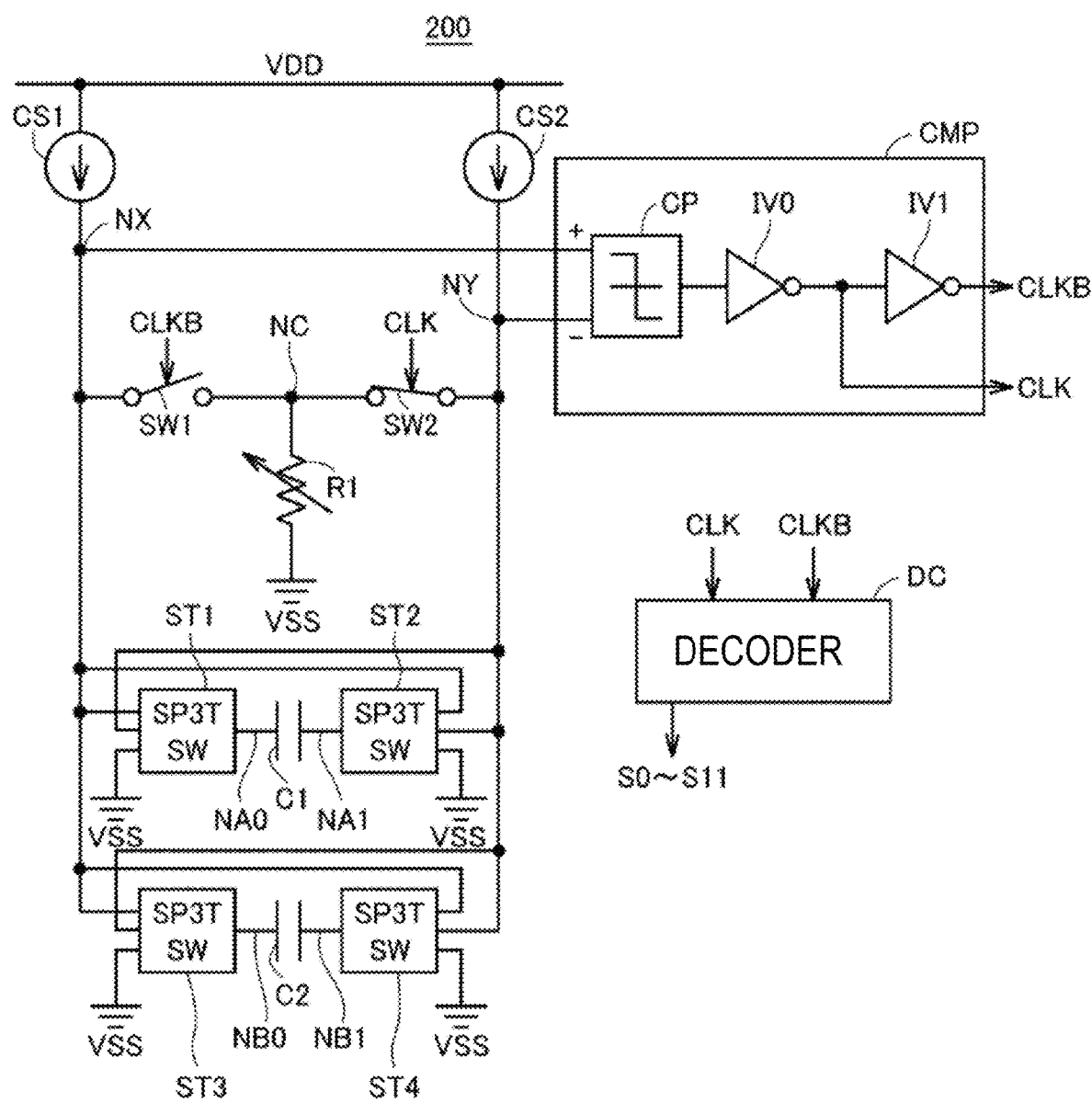
FIG. 6 is a diagram illustrating the configuration of the oscillator circuit 200 according to a second embodiment.

FIG. 6 is a diagram for explaining a configuration of the oscillation circuit 200 according to the second embodiment.

Referring to FIG. 6, the oscillator circuit 200 includes: current sources CS1 and CS2, a resistive element R1, capacitive elements C1 and C2, switches SW1 to SW2, a three-output switch (SP3TSW) ST1-ST4, a comparing unit CMP, and a decoder DC. The switches SW1 to SW6 receive input of the positive phase clock signal CLK or the reversed phase clock signal CLKB to perform a switching operation.

The comparing unit CMP includes a comparator CP and inverters IV0, IV1. The inverter IV0 inverts the output of the comparator CP to output the positive phase clock signal CLK.

The Inverter IV1 inverts the input of inverter IV0 and outputs reversed phase clock signal CLKB.

In the capacitive element C1, one is a node NA0 and the other is a node NA1. In the capacitive element C2, one is a node NB0 and the other is a node NB1.

The current source CS1, CS2 is configured by a current mirror circuit using a MOS transistor, for example.

The switch SW1, SW2 is composed of, for example, a MOS transistor. The current source CS1 is connected between power the supply node (power supply voltage VDD) and the node NX and provides a constant current Ic.

Current source CS2 is connected between the power supply node (power supply voltage VDD) and the node NY and provides the constant current Ic.

One input terminal of the comparator CP is connected to the node NX, and the other is connected to the node NY. The comparator CP compares the potential of the node NX and the potential of the node NY, and outputs a signal corresponding to the result of the comparison.

The node NA0 of the capacitive element C1 is connected to a three-output switch ST1. The three-output switch ST1 connects the node NA0 to any one of the fixed voltage node (fixed voltage VSS), the node NX, and the node NY in accordance with the switch control signals S0, S2, and S4 output from the decoder DC.

The node NA1 of the capacitive element C1 is connected to the three-output switch ST2. The three-output switch ST2 is connected to the node NA1 and any one of the fixed voltage node (fixed voltage VSS), the node NX, and the node NY in accordance with the switch control signals S1, S3, and S5 output from the decoder DC.

The node NB0 of the capacitive element C2 is connected to the three-output switch ST3. The three-output switch ST3 is connected to the node NB0 and any one of the fixed voltage node (fixed voltage VSS), the node NX, and the node NY in accordance with the switch control signals S6, S8, and S10 output from the decoder DC.

The node NB1 of the capacitive element C2 is connected to the three-output switch ST4. The three-output switch ST4 is connected to the node NB1 and any one of the fixed voltage node (fixed voltage VSS), the node NX, and the node NY in accordance with the switch control signals S7, S9, and S11 output from the decoder DC.

The resistive element R1 is connected between the node NC and the fixed voltage node (fixed voltage VSS). The resistive element R1 is a variable resistive element whose resistance value is adjustable. The oscillation frequency can be adjusted by adjusting the resistance value.

The switch SW1 is connected between the node NX and the node NC, and receives an input of the reversed phase clock signal CLKB.

The switch SW2 is connected between the node NY and the node NC, and receives an input of the positive phase clock signal CLK.

The switches SW1 and SW2, the three-output switches ST1 to ST4, and the decoder DC constitute a switch control circuit for controlling the connection relationship of the current sources CS1 and CS2, the fixed voltage node (fixed voltage VSS), the capacitive elements C1, C2, and the resistive element R1.

Figure 7:
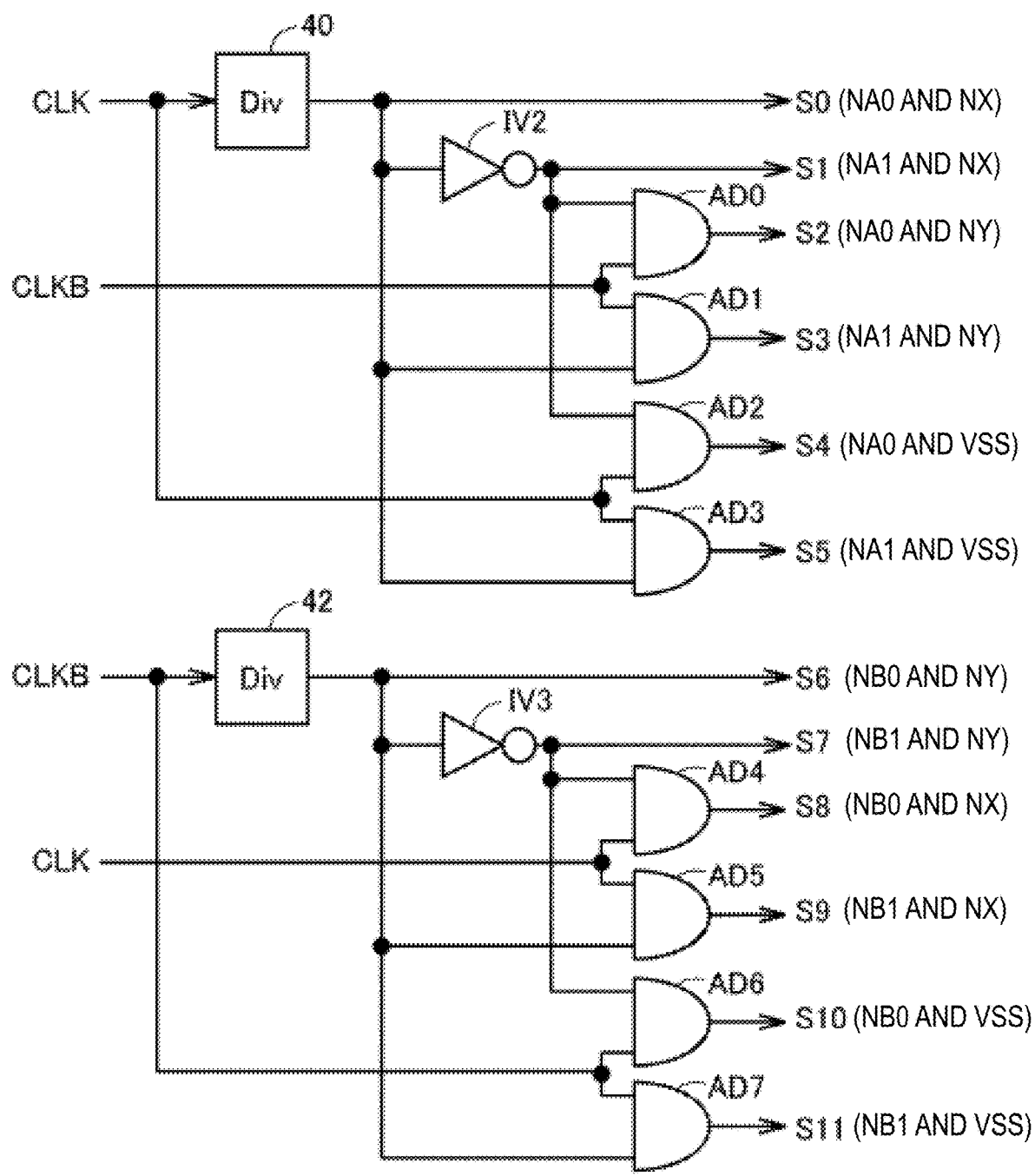
FIG. 7 is a circuit diagram for explaining a circuit configuration of a decoder DC according to the second embodiment.

FIG. 7 is a circuit diagram for explaining a circuit configuration of a decoder DC according to the second embodiment. Referring to FIG. 7, the decoder DC includes frequency dividers 40 and 42, inverters IV2 and IV3, and AND circuits AD0 to AD11.

The frequency divider 40 divides the frequency of the positive phase clock signal CLK by ½ and outputs the divided frequency as the switch control signal S0. The switch control signal S0 (H level) connects the node NA0 and the node NX.

The inverter IV2 inverts the output of the frequency divider 40 and outputs the inverted output as the switch control signal S1. The switch control signal S1 (H level) connects the node NA1 and the node NX.

The AND circuit AD0 outputs an AND logic operation result of the output of inverter IV2 and the reversed phase clock signal CLKB as a switch control signal S2. The switch control signal S2 (H level) connects the node NA0 and the node NY.

The AND circuit AD1 outputs the output of the frequency divider 40 and the AND logic operation result of the reversed phase clock signal CLKB as the switch control signal S3. The switch control signal S3 (H level) connects the node NA1 and the node NY.

The AND circuit AD2 outputs an AND logic operation result of the output of the inverter IV2 and the positive phase clock signal CLK as a switch control signal S4. The switch control signal S4 (H level) connects the node NA0 and fixed voltage node (fixed voltage VSS).

The AND circuit AD3 outputs an AND logic operation result of the output of the frequency divider 40 and the positive phase clock signal CLK as the switch control signal S5. The switch control signal S5 (H level) connects the node NA1 and the fixed voltage node (fixed voltage VSS).

The frequency divider 42 divides the frequency of the reversed phase clock signal CLKB by ½ and outputs the divided frequency as the switch control signal S6. The switch control signal S6 (H level) connects the node NB0 and the node NY.

The inverter IV3 inverts the output of the frequency divider 42 and outputs the inverted output as the switch control signal S7. The switch control signal S7 (H level) connects the node NB1 and the node NY.

The AND circuit AD4 outputs the AND logic operation result of the output of the inverter IV3 and the positive phase clock signal CLK as the switch control signal S8. The switch control signal S8 (H level) connects the node NB0 and the node NX.

The AND circuit AD5 outputs the output of the frequency divider 42 and the AND logic operation result of the positive phase clock signal CLK as the switch control signal S9. The switch control signal S9 (H level) connects the node NB1 and the node NX.

The AND circuit AD6 outputs the output of the inverter IV3 and the AND logic operation result of the reversed phase clock signal CLKB as the switch control signal S10. The switch control signal S10 (H level) connects the node NB0 and the fixed voltage node (fixed voltage VSS).

The AND circuit AD7 outputs the output of the frequency divider 42 and the AND logic operation result of the reversed phase clock signal CLKB as the switch control signal S11. The switch control signal S11 (H level) connects the node NB1 and the fixed voltage node (fixed voltage VSS).

Figure 8:
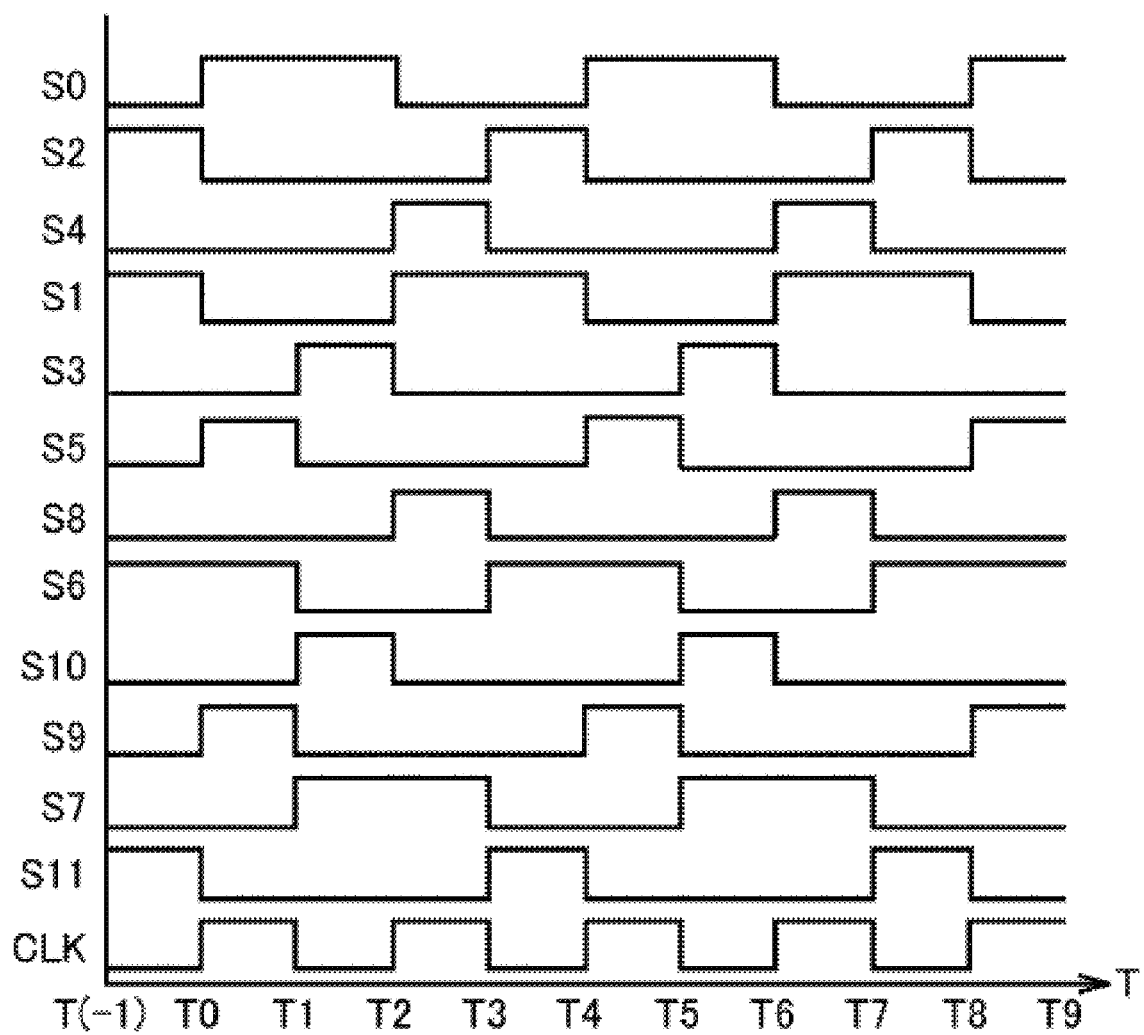
FIG. 8 is a diagram for explaining switch control signals S0 to S11 outputted from a decoder DC according to the second embodiment.

FIG. 8 is a diagram for explaining switch control signals S0 to S11 outputted from the decoder DC according to the second embodiment.

Referring to FIG. 8, in a time T0, the positive phase clock signal CLK is set to "H" level, and the reversed phase clock signal BCLK is set to "L" level.

In accordance with this, the switch control signal S0 is set to "H" level. The switch control signal S2 is set to "L" level. The switch control signal S4 maintains "L" level. The three-output switch ST1 connects the node NA0 and the node NX.

The switch control signal S1 is set to "L" level. The switch control signal S3 maintains "L" level. The switch control signal S5 is set to "H". The three-output switch ST2 connects the node NA1 and fixed voltage node (fixed voltage VSS).

The switch control signal S8 maintains "L" level. The switch control signal S6 maintains the "H" level. The switch control signal S10 maintains "L" level. The switch ST3 connects the node NB0 and the node NY.

The switch control signal S9 is set to "H". The switch control signal S7 maintains the "L" level. The switch control signal S11 is set to "L" level. The switch ST4 connects the node NB1 and the node NX.

This sets the first connection status. Next, in the time T1, the positive phase clock signal CLK is set to the "L" level, and the reversed phase clock signal BCLK is set to the "H" level.

According to this, the switch control signal S0 maintains the "H" level. The switch control signal S2 maintains the "L" level. The switch control signal S4 maintains the "L" level. The three-output switch ST1 connects the node NA0 and the node NX.

The switch control signal S1 maintains the "L" level. The switch control signal S3 is set to "H" level. The switch control signal S5 maintains "L" level. The three-output switch ST2 connects the node NA1 and the node NY.

The switch control signal S8 maintains "L" level. The switch control signal S6 is set to "L" level. The switch control signal S10 is set to "H" level. The switch ST3 connects the node NB0 and the fixed voltage node (fixed voltage VSS).

The switch control signal S9 is set to "L". The switch control signal S7 is set to "H". The switch control signal S11 maintains the "L" level. The switch ST4 connects the node NB1 and the node NY.

This sets the second connection status. In the time T2, the positive phase clock signal CLK is set to the "H" level, and the reversed phase clock signal BCLK is set to the "L" level.

According to this, the switch control signal S0 is set to "L" level. The switch control signal S2 maintains the "L" level. The switch control signal S4 is set to "H" level. The three-output switch ST1 connects the node NA0 and the fixed voltage node (fixed voltage VSS).

The switch control signal S1 is set to "H" level. The switch control signal S3 is set to "L" level. The switch control signal S5 maintains "L" level. The three-output switch ST2 connects the node NA1 and the node NX.

The switch control signal S8 is set to "H" level. The switch control signal S6 maintains "L" level. The switch control signal S10 is set to "L" level. The switch ST3 connects the node NB0 and the node NX.

The switch control signal S9 maintains the "L" level. The switch control signal S7 is set to "H" level. The switch control signal S11 maintains the "L" level. The switch ST4 connects the node NB1 and the node NY.

This sets the third connection status. In the time T3, the positive phase clock signal CLK is set to the "L" level, and the reversed phase clock signal BCLK is set to the "H" level.

According to this, the switch control signal S0 maintains the "L" level. The switch control signal S2 is set to "H" level. The switch control signal S4 is set to "L" level. The three-output switch ST1 connects the node NA0 and the node NY.

The switch control signal S1 maintains the "H" level. The switch control signal S3 maintains the "L" level. The switch control signal S5 maintains the "L" level. The three-output switch ST2 connects the node NA1 and the node NX.

The switch control signal S8 is set to the "L" level. The switch control signal S6 is set to the "H" level. The switch control signal S10 maintains the "L" level. The switch ST3 connects the node NB0 and the node NY.

The switch control signal S9 maintains the "L" level. The switch control signal S7 is set to "L" level. The switch control signal S1 is set to "H" level. The switch ST4 connects the nodes NB1 and fixed voltage node (fixed voltage VSS).

This sets the fourth connection status. A connection status at the time T4 is set to the first connection status, similarly to that of the time T0. A connection status at the time T5 is set to the second connection status, similarly to that of the time T1. A connection status at the time T6 is set to the third connection status, similarly to that of the time T2. A connection status at the time T7 is set to the fourth connection status, similarly to that of the time T3. The same applies to the time after the time T8.

Next, the operation of the oscillator circuit 200 of the second embodiment will be described. FIGS. 9 to 12 show the equivalent circuits of each connection status.

Figure 9:
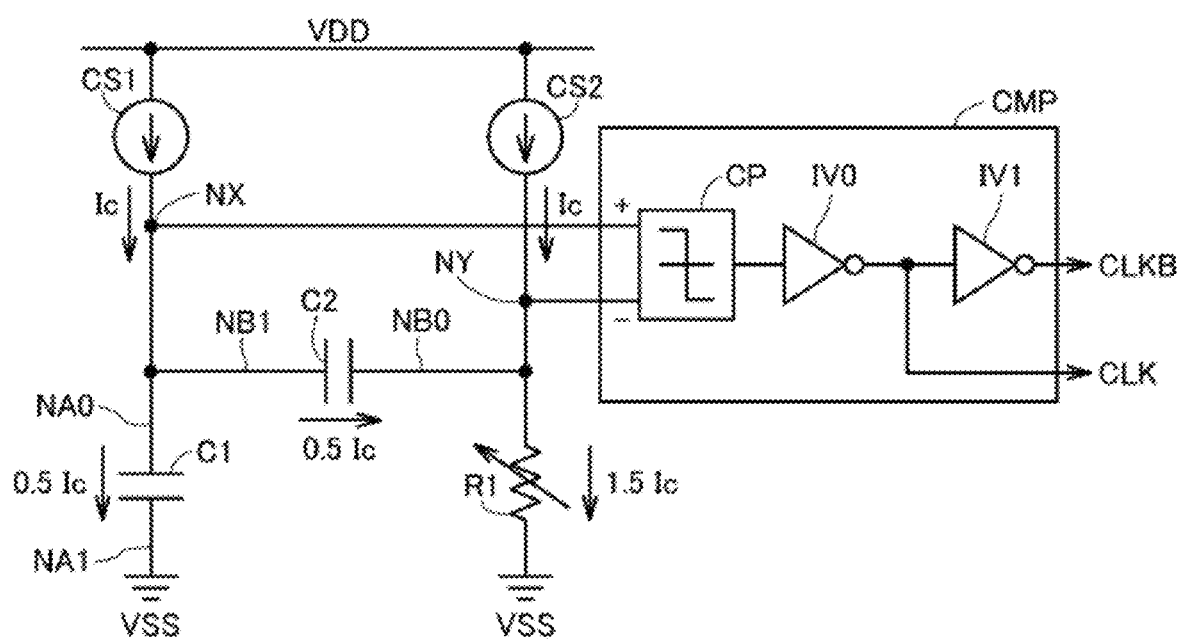
FIG. 9 is a diagram illustrating an equivalent circuit of a first connection status of the oscillator circuit 200 according to the second embodiment.

FIG. 9 is a diagram illustrating an equivalent circuit of a first connection status of the oscillator circuit 200 according to the second embodiment.

In the first connection status, the three-output switch ST1 connects the node NA0 and the node NX. The three-output switch ST2 connects the node NA1 and the fixed voltage node (fixed voltage VSS). The switch ST3 connects the node NB0 and the node NY. The switch ST4 connects the node NB1 and the node NX.

As shown in FIG. 9, the capacitive element C1 is charged by a current 0.5 Ic of the constant current Ic supplied from the current source CS1. As a result, the potential of the node NA0 rises in proportion to time.

A remaining current 0.5 Ic of constant current I supplied from current source CS1 discharges the charges stored in capacitive element C2.

The current 1.5 Ic, which is the sum of the current 0.5 Ic discharged from the capacitive element C2 and the current Ic supplied from the current source CS2, flows to the resistive element R1.

As a result, the potential of the node NY becomes a constant voltage determined from the resistance value of the resistive element R1 and the current value flowing to the resistive element R1.

When the potential of the node NX, which rises over time, reaches the potential of the node NY, the output of the comparator CP is inverted. The positive phase clock signal CLK outputted from the inverter IV0 transitions from the "H" level to the "L" level. The reversed phase clock signal CLKB output from inverter IV1 shifts from the "L" level to the "H" level.

Figure 10:
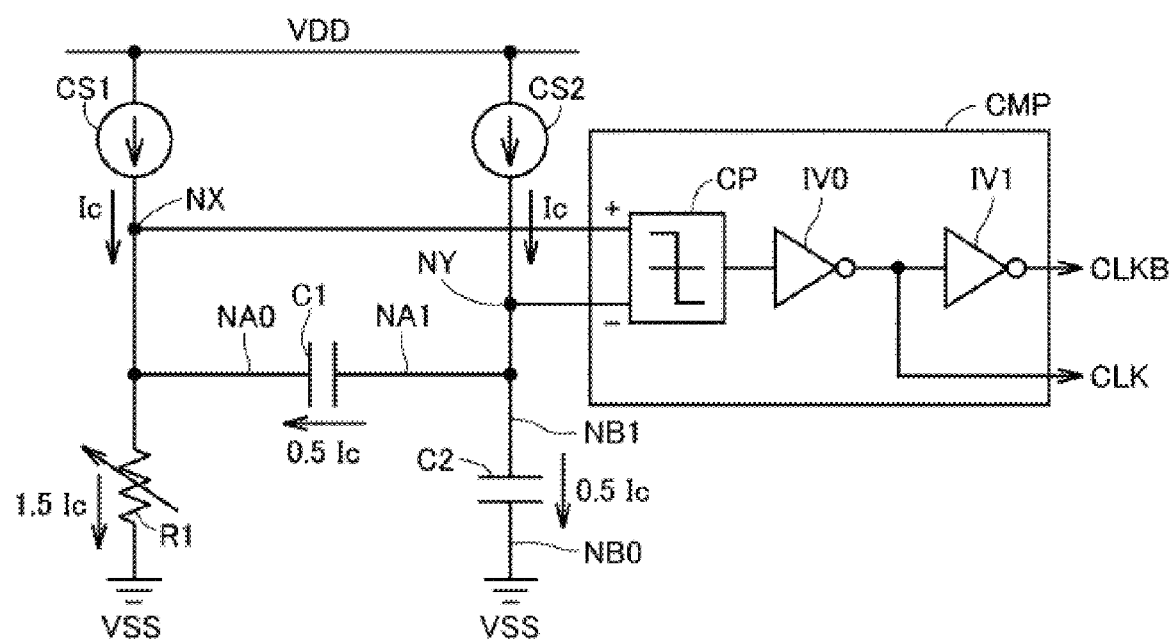
FIG. 10 is a diagram illustrating an equivalent circuit of the second connection status of the oscillator circuit 200 according to the second embodiment.

FIG. 10 is a diagram for explaining an equivalent circuit of the second connection status of the oscillator circuit 200 according to the second embodiment.

In the second connection status, the three-output switch ST1 connects the node NA0 and the node NX. The three-output switch ST2 connects the node NA1 and the node NY. The switch ST3 connects the node NB0 and the fixed voltage node (fixed voltage VSS). The switch ST4 connects the node NB1 and the node NY.

As shown in FIG. 10, the capacitive element C2 is charged by a current of 0.5 Ic of the constant current Ic supplied from the current source CS2. As a result, the potential of the node NB1 rises in proportion to time.

The remaining current 0.5 Ic of the constant current Ic supplied from the current source CS2 discharges the charges stored in the capacitive element C1.

The current 1.5 Ic, which is the sum of the current 0.5 I discharged from the capacitive element C1 and the current Ic supplied from the current source CS1, flows to the resistive element R1.

As a result, the potential of the node NX becomes a constant voltage determined from the resistance value of the resistive element R1 and the current value flowing to the resistive element R1.

When the potential of the node NX, which rises over time, reaches the potential of the node NY, the output of the comparator CP is inverted. The positive phase clock signal CLK outputted from the inverter IV0 transitions from the "L" level to the "H" level. The reversed phase clock signal CLKB outputted from inverter IV1 shifts from the "H" level to the "L" level.

Figure 11:
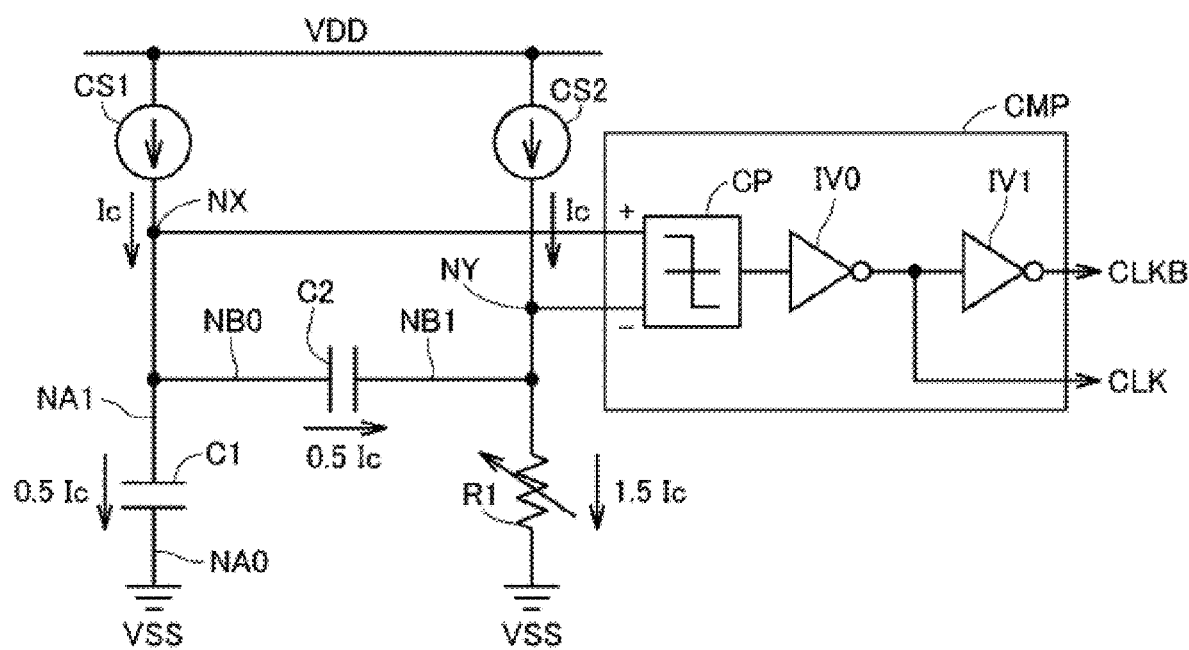
FIG. 11 is a diagram illustrating an equivalent circuit of a third connection status of the oscillator circuit 200 according to the second embodiment.

FIG. 11 is a diagram for explaining an equivalent circuit of a third connection status of the oscillator circuit 200 according to the second embodiment.

In the third connection status, the three-output switch ST1 connects the node NA0 and the node NX. The three-output switch ST2 connects the node NA1 and fixed voltage node (fixed voltage VSS). The switch ST3 connects the node NB0 and the node NY. The switch ST4 connects the node NB1 and the node NX.

As shown in FIG. 11, the capacitive element C1 is charged by a current of 0.5 Ic of the constant current Ic supplied from the current source CS1. As a result, the potential of the nodes NA0 rises in proportion to time.

The remaining current 0.5 Ic of the constant current I supplied from current source CS1 discharges the charges stored in the capacitive element C2.

The current 1.5 Ic, which is the sum of the current 0.5 Ic discharged from the capacitive element C2 and the current Ic supplied from the current source CS2, flows to the resistive element R1.

As a result, the potential of the node NY becomes a constant voltage determined from the resistance value of the node resistive element R1 and the current value flowing to the node resistive element R1.

When the potential of the node NX, which rises over time, reaches the potential of the node NY, the output of the comparator CP is inverted. The positive phase clock signal CLK outputted from the inverter IV0 transitions from the "H" level to the "L" level. The reversed phase clock signal CLKB output from inverter IV1 shifts from the "L" level to the "H" level.

Figure 12:
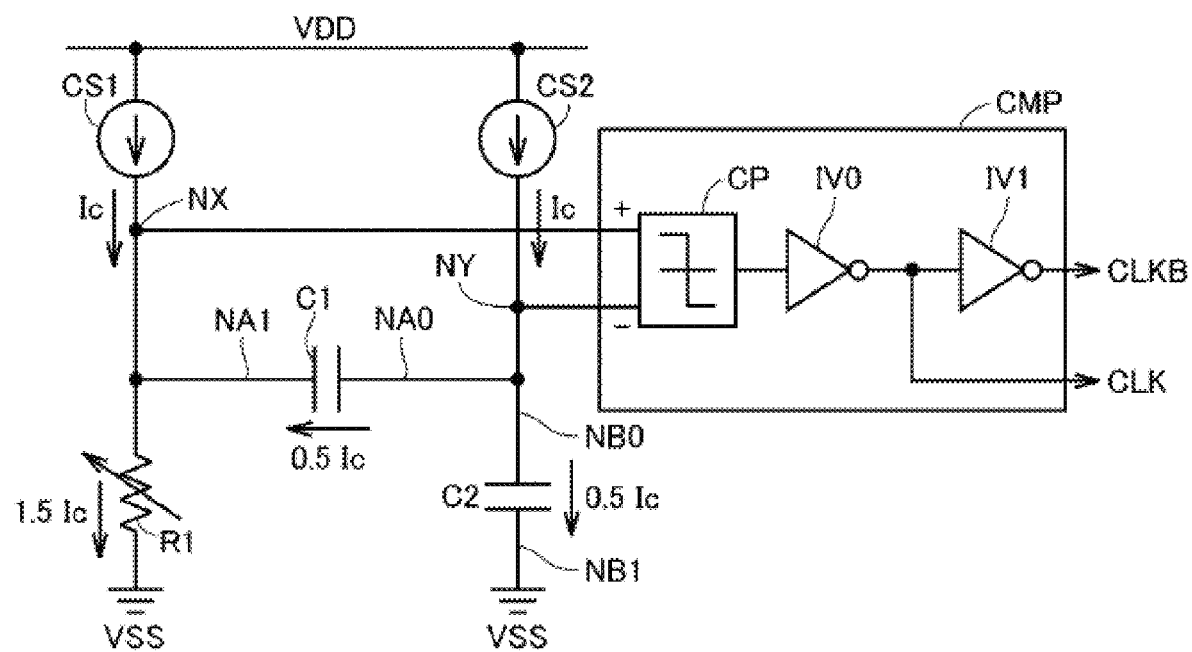
FIG. 12 is a diagram illustrating an equivalent circuit of a fourth connection status of the oscillator circuit 200 according to the second embodiment.

FIG. 12 is a diagram for explaining an equivalent circuit of a fourth connection status of the oscillator circuit 200 according to the second embodiment.

In the fourth connection status, the three-output switch ST1 connects the node NA0 and the node NX. The three-output switch ST2 connects the node NA1 and the node NY. The switch ST3 connects the node NB0 and the fixed voltage node (fixed voltage VSS). The switch ST4 connects the node NB1 and the node NY.

As shown in FIG. 12, the capacitive element C2 is charged by a current 0.5 Ic of the constant current Ic supplied from the current source CS2. As a result, the potential of the node NB1 rises in proportion to time.

The remaining current 0.5 Ic of the constant current Ic supplied from the current source CS2 discharges the charge stored in the capacitive element C1.

The current 1.5 Ic, which is the sum of the current 0.5 I discharged from the capacitive element C1 and the current Ic supplied from the current source CS1, flows to the resistive element R1.

As a result, the potential of the node NX becomes a constant voltage determined from the resistance value of the node resistive element R1 and the current value flowing to the node resistive element R1.

When the potential of the node NX, which rises over time, reaches the potential of the node NY, the output of the comparator CP is inverted. The positive phase clock signal CLK outputted from the inverter IV0 transitions from the "L" level to the "H" level. The reversed phase clock signal CLKB output from inverter IV1 shifts from the "H" level to the "L" level.

In this way, the positive phase clock signal CLK repeats transitions from the "H" level to the "L" level and from the "L" level to the "H" level. Therefore, the oscillator circuit 200 performs the oscillation operation by the process.

Figure 13:
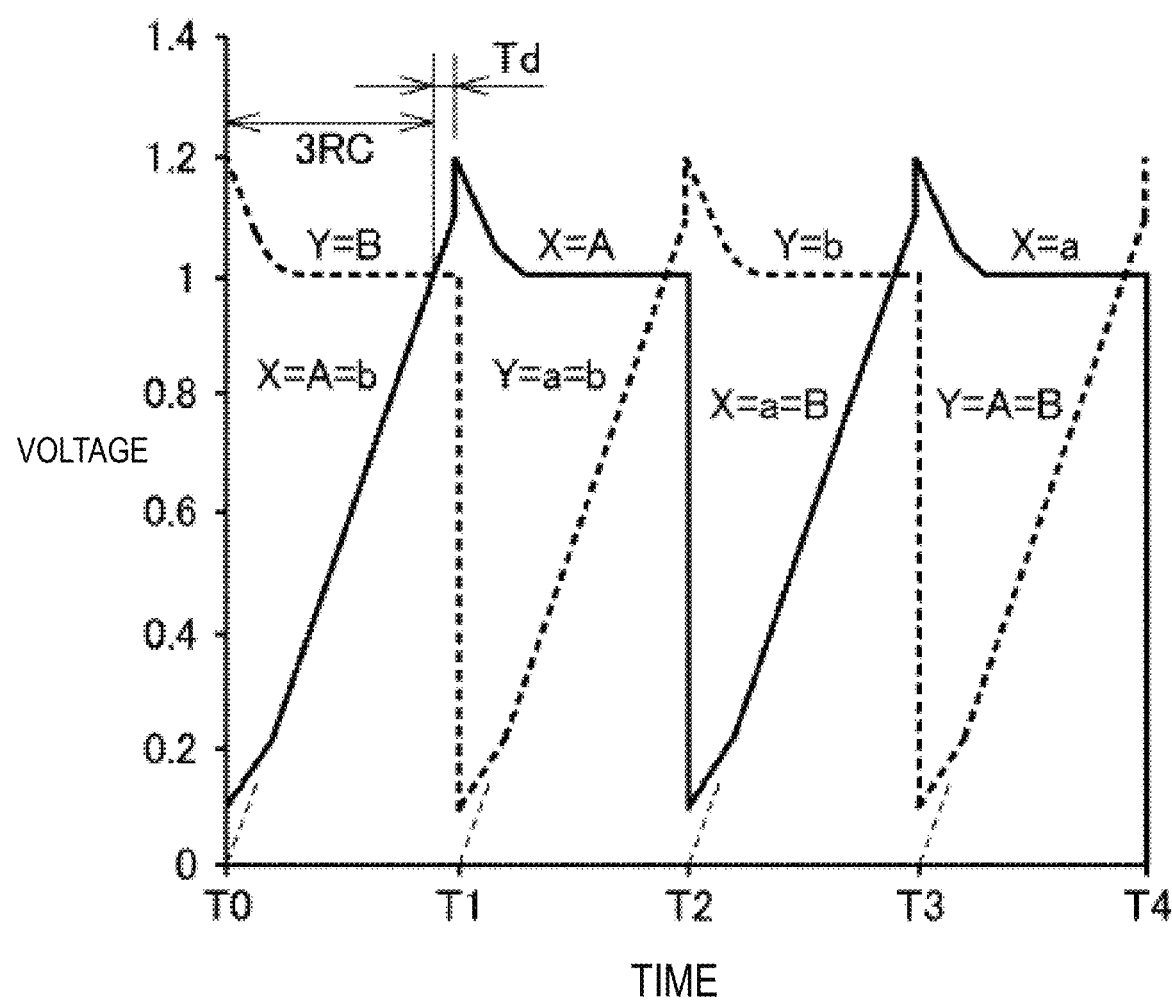
FIG. 13 is a diagram illustrating changes in the potentials of the nodes NX and NY of the oscillator circuit 200 according to the second embodiment.

FIG. 13 is a diagram for explaining changes in the potentials of the nodes NX and NY of the oscillator circuit 200 according to second embodiment.

As shown in FIG. 13, the period until the potential of the node NX reaches the constant voltage (reference voltage) of the node NY corresponds to the period of ½ of the period oscillation period. The capacitive element C1 is charged by a current of 0.5 Ic, and the potential of the node NX rises.

Therefore, when the oscillation period is T, the capacitance value of the capacitive elements C1, C2 is C, the resistance value of resistive element R1 is R, and the current value of current source CS1, CS2 is Ic, the idealized oscillation period T is 6 RC, similarly to the first embodiment.

On the other hand, in an actual circuit, similarly to the first embodiment, the comparator CP have a delay time from when the input signal changes to when the output signal changes. As a result, an overshoot occurs in the nodes NX and NY.

Figure 14:
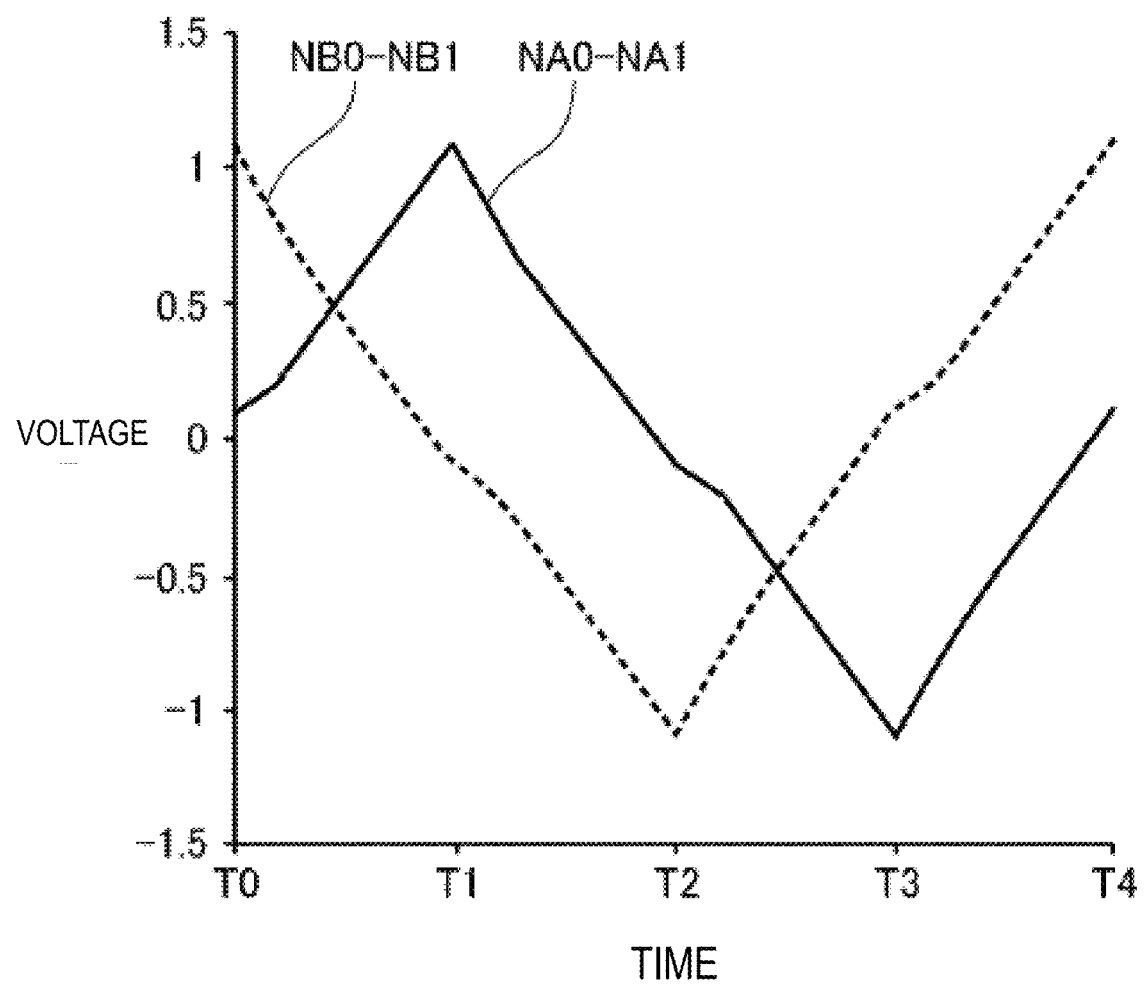
FIG. 14 is a diagram illustrating transitions of voltages between terminals of the capacitive elements C1 and C2 of the oscillator circuit 200 according to second embodiment.

FIG. 14 is a diagram for explaining transitions of voltages between terminals of the capacitive elements C1 and C2 of the oscillator circuit 200 according to the second embodiment.

As shown in FIG. 14, the terminal voltage of the capacitive element C1 and C2 ideally has a triangular wave of that reciprocate between 0 and the reference voltage.

In the oscillator circuit 200 according to the second embodiment, a delay of the delay time Td occurs in a half cycle. Taking this into account, the oscillation period Ta of the oscillator circuit 100 is determined by the following equation (6) when the delay time of the comparator CP is Td.

$$Ta = 6RC + 2Td \tag{6}$$

Therefore, the oscillator circuit 200 according to the second embodiment has less delay time impact than that of the configuration of the oscillator circuit 100 according to first embodiment.

The oscillator circuit 200 according to the second embodiment uses a method of reversing the connection polarity of a capacitive element whose voltage between terminals is closer to zero when the output of the comparator CP is inverted. This makes it possible to cancel an extra charge.

Figure 15:
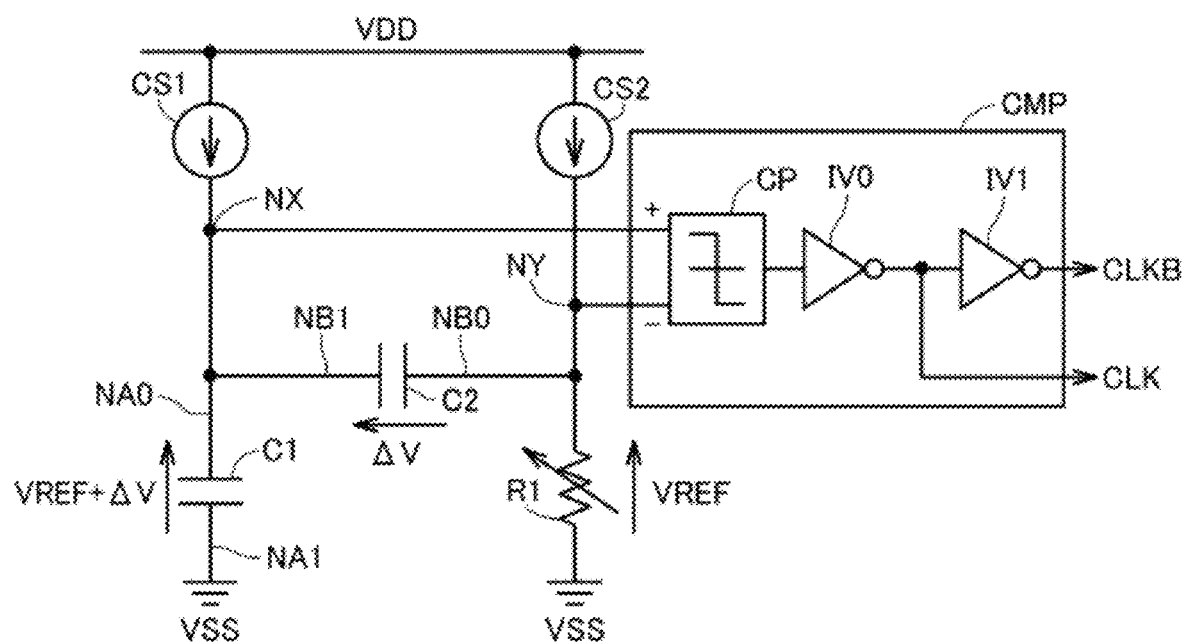
FIG. 15 is a diagram for explaining a state when switching from the first connection status to the second connection status of the oscillator circuit 200 according to the second embodiment.

FIG. 15 is a diagram for explaining a state when switching from the first connection status to the second connection status of the oscillator circuit 200 according to second embodiment.

As shown in FIG. 15, the voltage between the terminal of the node NA0 and the node NA1 of the capacitive element C1 is set to reference voltage VREF+overshoot voltage ΔV by the effect of the delay of the comparator CP. At this time, the terminal voltage between the node NB1 and the node NB0 of the capacitive element C2 is set to the voltage ΔV.

Figure 16:
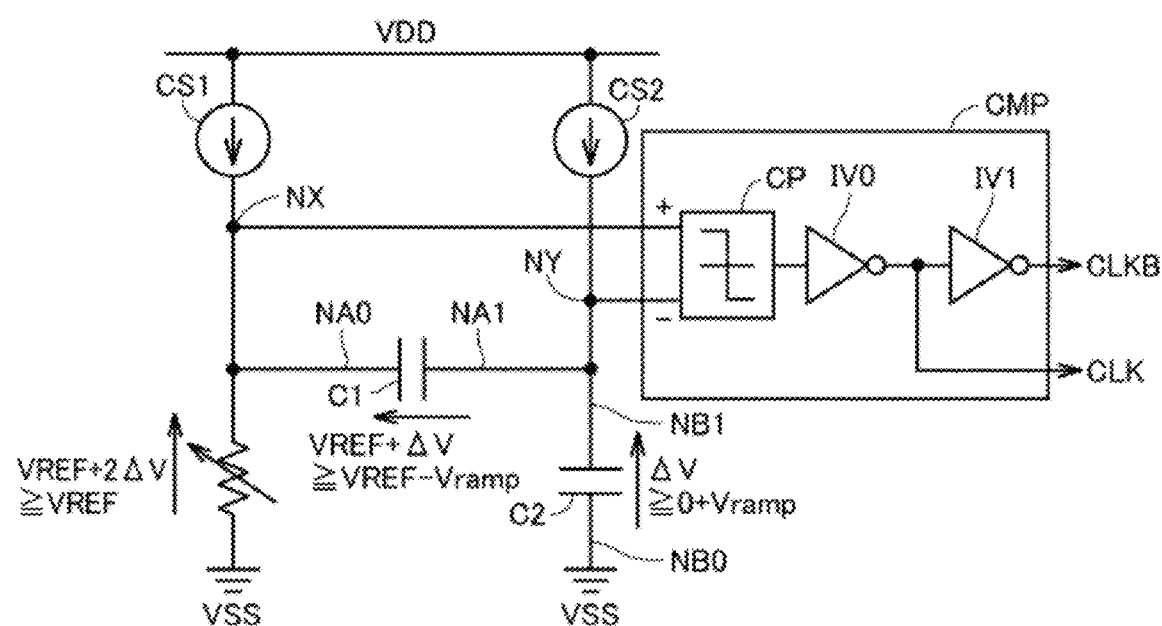
FIG. 16 is a diagram for explaining a state when the second connection status of the oscillator circuit 200 is switched according to the second embodiment.

FIG. 16 is a diagram for explaining a state when the second connection status of the oscillator circuit 200 is switched according to the second embodiment.

As shown in FIG. 16, according to the switching of the second connection status, the potential of the node NY is set to the voltage ΔV of the terminal voltage between the node NB1 and the node NB0 of the capacitive element C2.

The potential of the node NX is set to the reference voltage VREF+2ΔV. Since the potential of the node NX converges to the reference voltage VREF, the components of the voltage ΔV originally existing at the node NY also disappear due to the capacitive voltage division in the process. That is, the overshoot voltage ΔV is cancelled.

Likewise, the same phenomena occurs when transitioning from the third connection status described with reference to FIG. 11 to the fourth connection status described with reference to FIG. 12.

Therefore, the oscillator circuit 200 according to second embodiment can further suppress the deterioration of the oscillation frequency accuracy because the output noise caused by the delay time variation of the comparator CP is halved as compared with the oscillator circuit 100 according to first embodiment.

Although the present disclosure has been specifically described based on the embodiments described above, the present disclosure is not limited to the embodiments, and it is needless to say that various modifications can be made without departing from the gist thereof.

What is claimed is:

1. An oscillator circuit comprising:
   a first constant current source;
   a second constant current source;
   a comparator having a first input terminal connected to the first constant current source and a second input terminal connected to the second constant current source;
   a first capacitive element having a first terminal and a second terminal;
   a second capacitive element having a third terminal and a fourth terminal;
   a resistive element having a fifth terminal connected to one of the first constant current source and the second constant current source, and a sixth terminal connected to a fixed voltage node; and
   wherein in a first state, the first terminal is connected to the first constant current source, the second terminal is connected to the fixed voltage node, the third terminal is connected to the second constant current source, the fourth terminal is connected to the first current source, and the fifth terminal is connected to the second constant current source, and
   wherein in a second state, the first terminal is connected to the second constant current source, the second terminal is connected to the first constant current source, the third terminal is connected to the second constant current source, the fourth terminal is connected to the fixed voltage node, and the fifth terminal is connected to the first constant current source.

2. The oscillator circuit according to claim 1, further comprising a switch control circuit controlling a connection relationship of the first constant current source, the second constant current source, the fixed voltage node, the first capacitive element, the second capacitive element, and the resistive element based on an output signal of the comparator.

3. An oscillator circuit comprising:
   a first constant current source;
   a second constant current source;
   a comparator having one input terminal connected to the first constant current source and the other input terminal connected to the second constant current source;
   a first capacitive element;
   a second capacitive element;
   a resistive element having one side connected to one of the first constant current source and the second constant current source, and the other terminal connected to a fixed voltage node; and
   a switch control circuit controlling a connection relationship of the first constant current source, the second constant current source, the fixed voltage node, the first capacitive element, the second capacitive element, and the resistive element based on an output signal of the comparator;
   wherein the switch control circuit switches a first state and a second state,
   wherein in the first state, one side of the first capacitive element is connected to the first constant current source, the other side of the first capacitive element is connected to the fixed voltage node, one side of the second capacitive element is connected to the second constant current source, the other side of the second capacitive element is connected to the first current source, and the one side of the resistive element is connected to the second constant current source, and
   wherein in the second state, the one side of the first capacitive element is connected to the second constant current source, the other side of the first capacitive element is connected to the first constant current source, the one side of the second capacitive element is connected to the second constant current source, the other side of the second capacitive element is connected to the fixed voltage node, and the one side of the resistive element is connected to the first constant current source.

4. The oscillator circuit of claim 3,
   wherein a polarity of the current flowing through the first capacitive element is opposite to each other in the first state and in the second state, and
   wherein a polarity of the current flowing through the second capacitive element is opposite to each other in the first state and in the second state.

5. The oscillator circuit of claim 3,
   wherein a polarity of the current flowing through the first capacitive element is reversed when transitioning from the first state to the second state, and
   wherein a polarity of the current flowing through the second capacitive element is reversed when transitioning from the second state to the first state.

6. The oscillator circuit according to claim 3,
   wherein the resistance element is a variable resistance element whose resistance value can be adjusted.

7. An oscillator circuit comprising:
   a first constant current source,
   a second constant current source,
   a comparator including:
      one input terminal connected to the first constant current source; and
      the other input terminal connected to the second constant current source;
   a first capacitive element;
   a second capacitive element;
   a resistive element including:
      one side connected to one side of the first constant current source and second constant current source;
      the other side connected to a fixed voltage node,
   a switch control circuit controlling connections of the first capacitive element, the second capacitive element, and the resistive element;

wherein the switch control circuit switches first to fourth states according to an output of the comparator, wherein in the first state, one side of the first capacitive element is connected to the first constant current source, the other side of the first capacitive element is connected to the fixed voltage node, one of the second capacitive element is connected to the second constant current source, the other side of the second capacitive element is connected to the first constant current source, and the one side of the resistive elements is connected to the second constant current source, wherein in the second state, one side of the first capacitive element is connected to the first constant current source, the other side of the first capacitive element is connected to the second constant current source, one side of the second capacitive element is connected to the fixed voltage node, the other side of the second capacitive element is connected to the second constant current source, and the one side of the resistive elements is connected to the first constant current source, wherein in the third state, one side of the first capacitive element is connected to the fixed voltage node, the other side of the first capacitive element is connected to the first constant current source, one side of the second capacitive element is connected to the first constant current source, the other side of the second capacitive element is connected to the second constant current source, and the one side of the resistive elements is connected to the second constant current source, and wherein in the fourth state, one side of the first capacitive element is connected to the second constant current source, the other side of the first capacitive element is connected to the first constant current source, one side of the second capacitive element is connected to the second constant current source, the other side of the second capacitive element is connected to the fixed voltage node, and the one side of the resistive elements is connected to the first constant current source.

\* \* \* \* \*